United States Patent [19]

Ponse et al.

[11] Patent Number: 5,260,599
[45] Date of Patent: Nov. 9, 1993

[54] CONDUCTIVE CLEARING FRAME FOR A SEMICONDUCTOR COMPONENT

[75] Inventors: Frederik Ponse, Unterhaching; Gabrielle Belle, Munich; Erwin Knapek, Unterhaching, all of Fed. Rep. of Germany

[73] Assignee: Siemens Aktiengesellschaft, Munich, Fed. Rep. of Germany

[21] Appl. No.: 611,732

[22] Filed: Nov. 13, 1990

[30] Foreign Application Priority Data

Nov. 28, 1989 [EP] European Pat. Off. ........ 89121925.5

[51] Int. Cl.$^5$ ............................................. H01L 27/02
[52] U.S. Cl. ...................................... 257/620; 257/797
[58] Field of Search ................ 357/40, 53, 68, 52, 357/71; 257/797, 629, 630, 620, 208, 544, 546

[56] References Cited

U.S. PATENT DOCUMENTS

| | | | |
|---|---|---|---|
| 3,772,576 | 11/1973 | Nienhuis et al. | 257/620 |
| 4,109,029 | 8/1978 | Ozedemir | 357/52 |
| 4,364,078 | 12/1982 | Smith et al. | 357/52 |
| 4,377,030 | 3/1983 | Pettenpaul et al. | 29/576 |
| 4,656,055 | 4/1987 | Dwyer | 357/71 R |
| 4,835,592 | 5/1989 | Zommer | 357/53 |
| 5,031,021 | 7/1991 | Baba et al. | 357/53 |
| 5,051,807 | 9/1991 | Morozumi et al. | 257/620 |

FOREIGN PATENT DOCUMENTS 2130788  6/1984  United Kingdom .

OTHER PUBLICATIONS

Matsumura et al., "Submicrometre Lift-Off Line with T-Shaped Cross-Sectional Form", Electronics Letters, vol. 17, No. 12, 1981, pp. 429–430.
Chao et al., "Electron-Beam Fabrication . . . Resist Technique", IEEE Trans. on Electron Devices, vol. ED-32, No. 6, 1985, pp. 1042–1046.
Morimoto et al., "A GaAs Metal Semiconductor . . . Ion Beams", J. Vac. Sci. Technol., vol. B5, No. 1, 1987, pp. 211–214.
Bandy et al., "Submicron GaAs . . . Source Resistances", IEEE Electron Device Letters, vol. EDL-4, No. 2, 1983, pp. 42–44.
"Voltage Contrast . . . Lithography", IBM Technical Disclosure Bulletin, vol. 28, No. 1, 1985, pp. 323–325.
Allison et al., "Microlithographic Techniques . . . Transistors", Solid State Technology, vol. 29, No. 6, 1986, pp. 169–175.

*Primary Examiner*—Rolf Hille
*Assistant Examiner*—Roy Potter
*Attorney, Agent, or Firm*—Hill, Steadman & Simpson

[57] ABSTRACT

A clearing frame for a semiconductor component is provided to enable a sufficient positioning of a particle beam. The clearing frame has a higher electrical conductivity than the environment thereof. The clearing frame also enables the determination of the layer resistance of the implantation via the high-frequency loss resistance measurement free from contact and destruction. The clearing frame can be placed at a fixed external DC potential, for example source or drain potential and therefore side gating effects can be avoided.

9 Claims, 3 Drawing Sheets

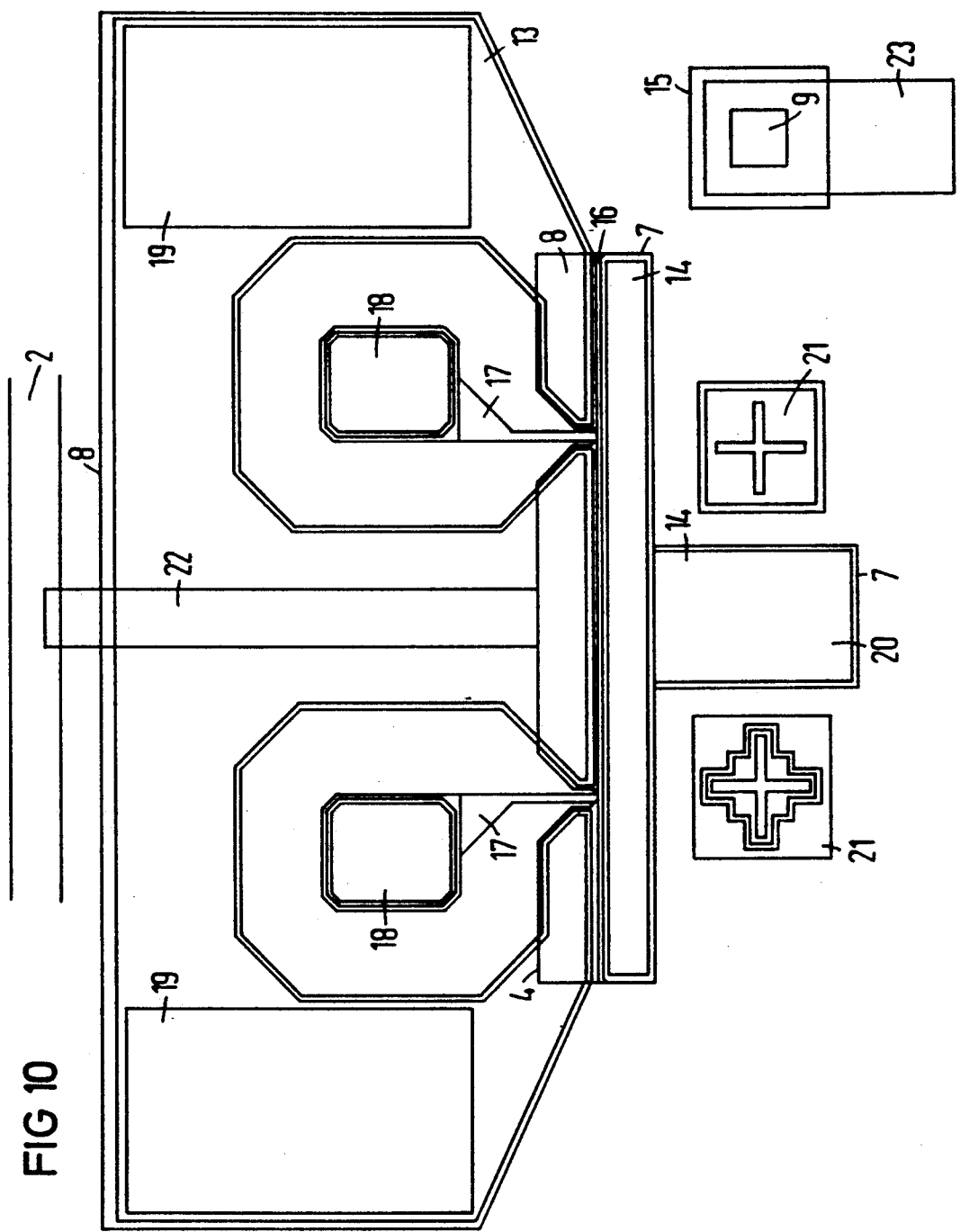

CONDUCTIVE CLEARING FRAME FOR A SEMICONDUCTOR COMPONENT

BACKGROUND OF THE INVENTION

1. Field of the Invention

The present invention relates to a clearing frame for a semiconductor component and more particularly to a clearing frame having a higher electrical conductivity than that of the environment of the clearing frame.

2. Description of the Prior Art

Semiconductor components are usually manufactured in composite form on wafers. In order to isolate the semiconductor components manufactured in a composite form, so-called clearing frames (also known as scribing frames) are provided between the individual semiconductor components. Along these clearing frames, the semiconductor components are isolated by way of sawing or via a different separating method that is known to those skilled in the art. These clearing frames are electrically conductive. If semi-insulating compound semiconductor substrates are used, these clearing frames are also semi-insulating.

The manufacture of semiconductor components, particularly the manufacture of compound semiconductor components, requires the generation of progressively-smaller structures, e.g. in the sub-micron range. For this purpose such fine structures are generated at least partially by exposure of any photosensitive resist with the assistance of particle beam writers. In such a method, electrical charges collect/accumulate on the surface of the wafer, and thereby influence the position of the particle beam and by that cause a deterioration of the fine structures to be generated. Also, when alignment marks are searched, the alignment marks being provided for the alignment of a particle beam on the surface of the wafer, charges develop on this surface which influence the position, or, respectively, the finding of the position of the particle beam.

This problem of charges on the surface of the semiconductor component to be generated is usually prevented when an electrically-conductive layer, e.g. composed of metal (aluminum), is deposited/evaporated. The removal of such an electrically-conductive layer, however, is always connected with difficulties.

SUMMARY OF THE INVENTION

The present invention, therefore, is based on the object of providing a clearing frame which enables a sufficient positioning of a particle beam.

The above problem is solved and the object is achieved with a clearing frame for a semiconductor component which is characterized by a higher electrical conductivity than the electrical conductivity of the environment of the clearing frame.

According to a particular feature of the invention, the clearing frame is characterized by a layer concentration of free charge carriers which is greater than $10^{10}$ cm$^{-2}$.

According to another feature of the invention, the clearing frame is characterized by a layer concentration of free charge carriers greater than $10^{11}$ cm$^{-2}$.

According to another feature of the invention, the clearing frame is characterized by a layer concentration of free charge carriers which is greater than $10^{12}$ cm$^{-2}$.

According to another feature of the invention, the clearing frame is characterized by a layer concentration of free charge carriers which is greater than $10^{14}$ cm$^{-2}$.

According to another feature of the invention, the clearing frame is characterized by an electrically-conductive connection with other areas on the surface of the semiconductor component.

According to another feature of the invention, the clearing frame is characterized by an electrically-conductive connection with the source zone or the drain zone of a field-effect transistor.

According to another feature of the invention, the clearing frame is characterized by an electrically-conductive connection with an alignment mark for the alignment of a particle beam.

The clearing frame is manufactured according to a method which is characterized by ion implantation of the clearing frame.

According to another feature of the invention, the method is characterized in that the clearing frame is implanted simultaneously with an implantation that is already used in the manufacturing process of the semiconductor component.

According to another feature of the invention, the application of a clearing frame is in connection with particle writing.

According to another feature of the invention is the application of a clearing frame for measuring the layer conductivity of an implanted zone without specific test structure and without specifically-executed contacts.

According to another feature of the invention is the application of a clearing frame for the determination of the surface potential in its proximity.

The invention offers many surprising advantages and can be applied in many different ways.

The invention is advantageously applicable in the case of semi-insulating semiconductor substrates composed of compound semiconductor material. Such compound semiconductor materials can be III–V compound semiconductors or II–IV compound semiconductors. Semi-insulating substrates composed of gallium arsenide have a high specific resistance of $10^7$–$10^8$ ohm cm. The present invention can also be applied advantageously for highly-resistive semiconductor substrates, also for silicon substrates or germanium substrates. The present invention can be advantageously applied for semiconductor substrates having low conductivity. Quite generally, the present invention enables, in the case of all semiconductor materials, the generation of structures or fine structures with more favorable properties, for example steeper edges or greater structure authenticity of the areas to be structured.

The present invention can be realized, for example, in that the clearing frame is doped higher than its environment. The electrical conductivity of the clearing frame is advantageously so high that electrical charges of those surfaces on which the particle beam incides are discharged in a reliable manner. The degree of the electrical conductivity of the clearing frame required for that purpose can thereby have various values with variously-advantageous effects. The higher the electrical conductivity of the clearing frame, the faster are charges on the inciding locations of the particle beam eliminated. An extrinsic conductivity of the clearing frame is advantageous for the elimination of charges at the inciding location of the particle beam.

In the case of semi-insulating semiconductor substrates it is favorable when the clearing frame has a layer concentration of free charge carriers of more than $10^{10}$ cm$^{-2}$. The clearing frames which have a charge carrier concentration of more than $10^{12}$ cm$^{-2}$ have good electrical conductivity.

When clearing frames are manufactured simultaneously with a channel of a field-effect transistor by implantation, these clearing frames advantageously have a layer charge-carrier concentration of $10^{11}$ cm$^{-2}$ or greater. When clearing frames are manufactured simultaneously with a contact layer of a field-effect transistor by way of implantation, these clearing frames advantageously have a layer charge concentration of $10^{12}$ cm$^{-2}$ or greater.

Advantageously, those surfaces on which the particle beam incides or in whose proximity the particle beam incides are connected in electrically-conductive fashion with the electrically-conductive clearing frame. For example, such surfaces are the active regions in field-effect transistors which are provided with gates; for example, such surfaces are those surfaces on which the alignment marks are located.

Advantageously, the clearing frame is doped simultaneously with an implantation that already occurs in the manufacturing process of the semiconductor component by way of the implantation. For example, the clearing frame is doped simultaneously with the n doping implantation of the component. For example, the clearing frame is doped simultaneously with the implantation of the channel of a field-effect transistor. For example also, the clearing frame is implanted together with the contact implantation and/or together with the guard rings. The clearing frame is doped, for example, simultaneously with the implantation of an alignment mark. The clearing frame can also be doped by way of several implantations, particularly by way of several implantations which are already provided in the manufacturing process of the semiconductor component.

In the case of a semi-insulating substrate, the electrically-conductive clearing frame enables that the surface of the substrate lies DC-wise on a defined potential, at least in the proximity of the clearing frame. In that the surface of the semiconductor component can reside on a defined potential, the clearing frame enables that side-gating effects are suppressed. If this property is not desired, the electrically-conductive clearing frame can be easily removed, e.g. via etching possibly in a self-adjusting fashion with the passivation layer as a cover for the active regions.

In a simple manner, the electrically-conductive clearing frame enables a high-frequency loss measurement of the corresponding implantation by way of an M gage measuring device. Thereby, the layer resistivity of the semiconductor component is measured, without external electrical terminals or contacts having to be present.

The present invention can be realized without greater expense. The masks for the generation of structures, e.g. by way of implantation which are already present, merely require an additional modification so that the clearing frame can also be implanted. The clearing frame is advantageously connected in an electrically-conductive fashion with semiconductor zones, which are later covered with photosensitive resist to be exposed (above implanted regions).

On the wafer, the clearing frame advantageously goes through to the edge of the wafer. On the edge of the wafer, the electrically-conductive clearing frame is connected with electrically-conductive terminals, for example composed of metal, with the electrically-conductive retainer of the wafer-retainer combination for the elimination of the charges.

The above-mentioned M gage measuring device for the high-frequency loss measurement measures the layer conductivity at the surface of the semiconductor component via high-frequency losses. When the clearing frame is implanted, a particularly favorable test signal is obtained.

The invention has already been realized when the clearing frame is additionally implanted. For the generation of an electrically-conductive clearing frame, it is not absolutely necessary that the clearing frame is implanted. When a semiconductor substrate, for example a wafer with an epitaxial layer comprises an already electrically-conductive epitaxial layer, the clearing frame is kept electrically conductive via the corresponding guidance of the etching processes. It is possible, for example, to leave at least part of an epitaxial layer structure (at least part of an epitaxial layer given several epitaxial layers arranged above one another) in the region of the clearing frame.

The present invention offers only advantages and is not connected with any disadvantages for the semiconductor components being manufactured.

The present invention can be applied in a particularly advantageous manner if a lift-off process is used for the manufacture of the semiconductor component, e.g. for the gate metalization in the case of field-effect transistors. Such lift-off processes are a standard procedure in the manufacture of metalizations for semiconductor components, as disclosed in U.S. Pat. No. 4,377,030, fully incorporated herein by this reference.

The present invention may be utilized in a particularly advantageous manner for particle beam writing of aligned fine structures. Such methods are described, for example, in Electronics Letters, Jun. 11, 1981, Vol. 17, No. 12, pp. 429-430; IEEE Transactions on Electron Devices, Vol. ED-32, No. 6, June 1985, pp. 1042-1046; J. Vac. Sci. Technol., B5 (1), January/February 1987, pp. 211-214; IEEE Electron Device Letters, Vol. EDL-4, No. 2, February 1983, pp. 42-44.

BRIEF DESCRIPTION OF THE DRAWINGS

Other objects, features and advantages of the invention, its organization, construction and operation will be best understood from the following detailed description, taken in conjunction with the accompanying drawings, on which:

FIGS. 9 and 10 illustrate and explain a clearing frame constructed in accordance with the present invention and its use.

DESCRIPTION OF THE PREFERRED EMBODIMENTS

Figure 1:
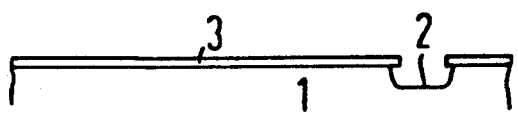
FIGS. 1-8 illustrate method steps of a method for manufacturing a semiconductor component, in which a clearing frame is produced according to the present invention.

The present invention can be applied in a particularly advantageous manner for the manufacture of field-effect transistors with gates written by way of an electron beam. The present invention enables the manufacture of low-noise gallium-arsenide MESFETS or HEMTS structures.

FIGS. 1-8 illustrate steps of a manufacturing process of a semiconductor component having a clearing frame 2 provided according to the present invention. The manufacture of the structures occurs in the mix and match method, i.e. the gate level is structured with the assistance of electron-beam lithography and the other levels are structured in conventional contact lithography. The electron beam lithography can occur using the Philips writer designated EBPG-4, or any other electron beam writer.

The present invention enables the optimization of the electron beam lithography. For the writing of the gate, for example, the two-layer PMMA (Polymethyl-methacrylate) process or a different resist technique can be used. The manufacturing process set forth in FIGS. 1–8 is stable towards follow-up processes. Lacquer openings smaller than 0.3 $\mu$m and gate lengths (relating to the metalization) smaller than 0.35 $\mu$m are achieved.

In the case of gallium-arsenide MESFETs, noise figures of, typically, 1.2 dB at 12 GHz are achieved with such gates.

Gate lengths smaller than 0.4 $\mu$m cannot be achieved in reproducible fashion with light-optical lithography. Therefore, an electron beam writer is used for structuring. Thereby, a two-layer PMMA (Polymethyl-methacrylate) system is used. However, one and three-layer photosensitive resist systems can be used as well. Also, gate lengths smaller than 0.25 $\mu$m can be realized.

In order to avoid charging when searching the alignment marks 9 and writing the structure 16, those surfaces that come in contact with the electron beam are implanted and connected in an electrically-conductive fashion with the electrically-conductive clearing frame 2. For the purpose of the present invention, it may suffice when surfaces which reside in the proximity of impact surfaces of the electron beam are connected in electrically-conductive fashion with the clearing frame. Such areas in the proximity of impact areas then act as discharge electrodes. The possibly non-implanted gate feed/supply surface 17, for example, is directly adjacent the implanted source and drain zones; charges can flow off via those zones to the connected clearing frame 2. For the purpose of the invention, it may also already suffice if only the clearing frame 2 serves as a shielding electrode. However, also the impact surfaces 9, 16 of the electron beam can be connected in an electrically-conductive fashion with the clearing frame 2. Such electrically-conductive connections can be separated again, if necessary, after a later process step (exposure of the photosensitive resist).

Particular attention is paid to the fashioning of structure-accurate, lift-off capable photoresist edges. Tests have shown that this can be achieved in an optimum manner with the described photoresist-exposure combination if charging is avoided via the clearing frame made conductive according to the present invention. Otherwise, such charging would be harmful to the structure authenticity and the edge profile due to the electron-optical effect. This also applies for the searching for the alignment mark 9 via the electron beam. The dose with which the electron beam writer scans over the mark 9 to be searched cannot be selected arbitrarily. The present invention enables, however, in avoiding the charging that lift-off capable photoresist edges are present in the area of the alignment marks as well.

In the exemplary embodiment, only the gate strip 16 and a portion 17 of the gate terminal pad are exposed with the electron beam. The large areas of the gate pads 18 are subsequently, together with the source 13 and the drain 14, structured by way of contact lithography in order to avoid an unnecessary increase of the writing time by way of the electron beam writers. Larger areas could also be exposed with an electron beam having different doses and/or different photoresists.

Referring to FIG. 1, a gallium-arsenide substrate 1 is coated with a layer 3 composed of silicon nitride having a thickness of 50 nm. With the assistance of photolithography, first the nitride layer 3 and the gallium-arsenide substrate 1 are etched for the generation of the clearing frame 2.

Figure 2:
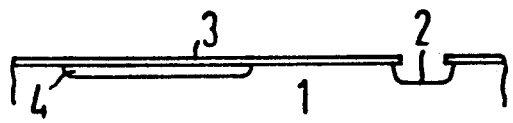

In FIG. 2, in the regions 4, a contact implantation with donor ions is performed. Simultaneously with this contact implantation, the clearing frame 2 can already be implanted. The regions 4 serve as active and contact layers of the semiconductor component. Silicon implantations with peak concentrations in the range of $10^{17}$–$10^{18}$ cm$^{-3}$ can be activated later almost completely via annealing. The layer doping of the active zones 4 can lie in the range of $10^{12}$–$10^{15}$ cm$^{-2}$.

Figure 3:
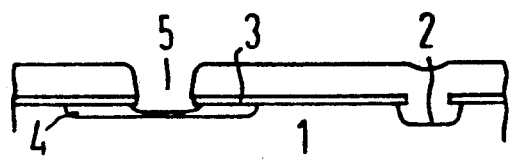

In FIG. 3, the channel recess 5 is performed. The rest of the nitride layer 3 remains after the channel recess is removed. The surface of the semiconductor substrate 1 is again provided with a new silicon-nitride layer (silicon-nitride cap) 3 having a thickness of 50 nm. Instead of the channel recess etching, the contact implantation can be selectively limited already during the contact implantation (FIG. 2) regarding the regions 5.

Figure 4:
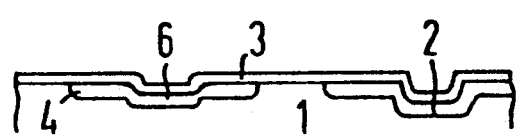

The channel 6, 16, the regions 23 for the electron beam mark 9 and the clearing frame 2 are advantageously jointly n implanted at the same time with a dose of $3$–$10 \times 10^{11}$ cm$^{-2}$ at an energy of 150 keV (FIG. 4). By this action, charging is avoided in the later electron beam writing, and as well, the other described advantages are achieved.

Figure 5:
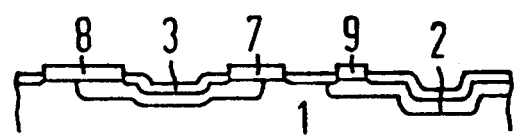

After the annealing of the implantation, the ohmic contacts 7 for the drain and 8 for the source are structured (FIG. 5). Thereby, at the same time, metallic alignment marks 9 for the electron beam writer are provided with a metallization (FIG. 5).

Figure 6:
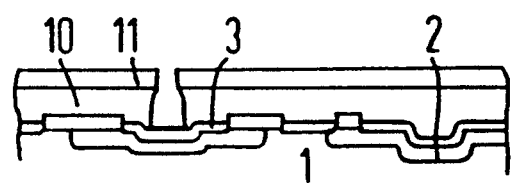

For the implementation of the electron beam gate structuring in FIG. 6, the surface of the semiconductor component is provided with the two-layer photoresist 10, 11. Then, the photoresist structure is exposed with the assistance of the electron beam writer and subsequently developed.

Before the gate recess, the silicon-nitride layer 3 in the gate region must be etched.

Figure 7:
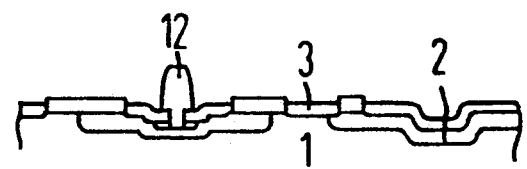
Figure 8:
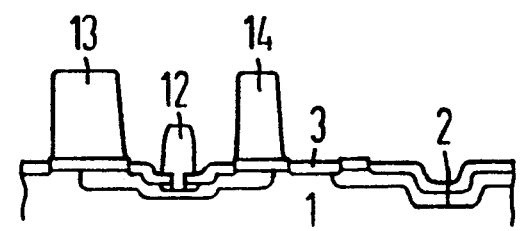

After the etching of the gate recess, the gate metalization 12 is manufactured by way of a lift-off process (FIG. 7). The gate terminals 18 and the source or drain terminals 19, 20 are structured in a separate additional photo technique step for reasons of the minimization of the writing time and a stabilization metal is applied on the drain 14, the source 13 and the gate 17, 18 (FIGS. 8, 10).

Subsequently, the semiconductor component is passivated.

Figure 9:
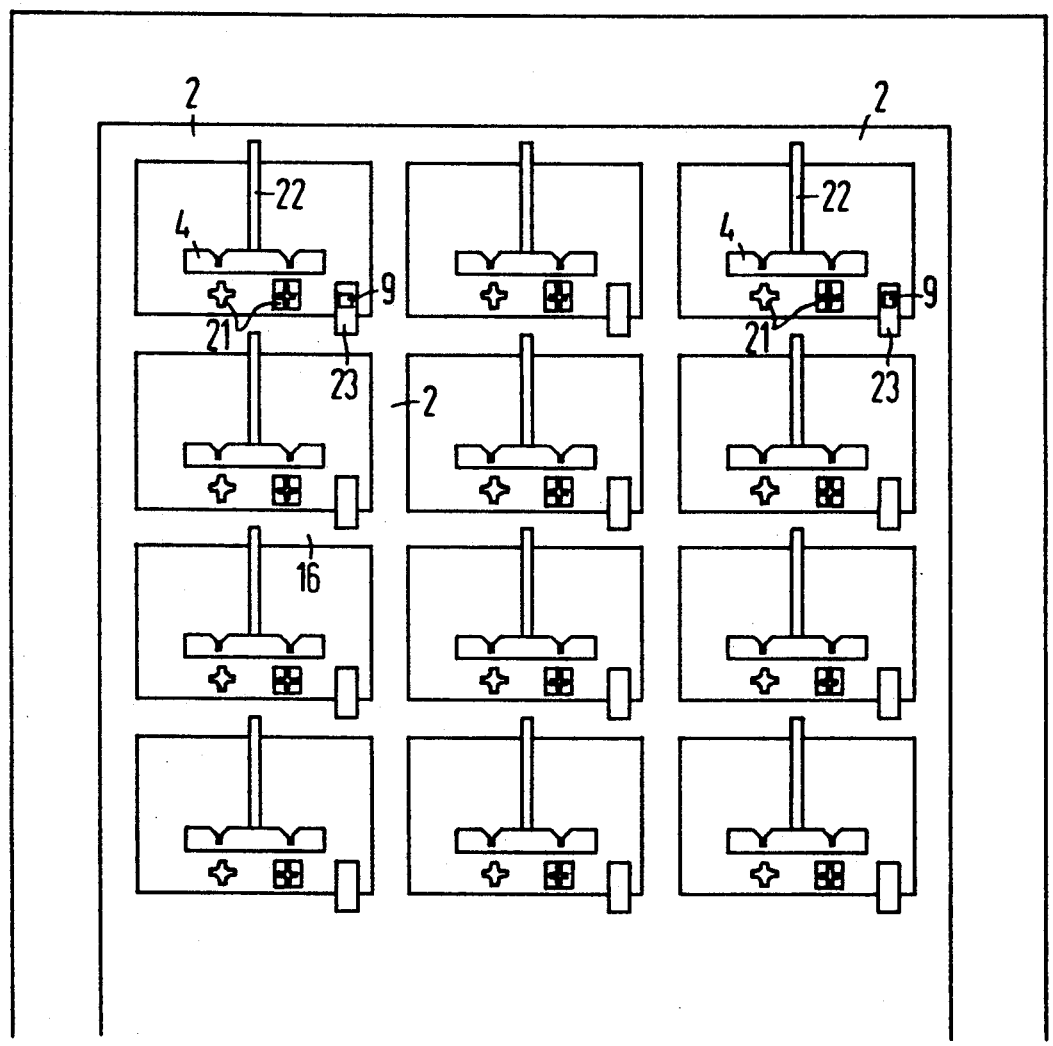

FIG. 9 illustrates a wafer on which several semiconductor components are manufactured at this same time. A clearing frame 2 is located around each semiconductor component. Each semiconductor component has surfaces 4, 23 which are connected in an electrically-conductive manner with the clearing frame 2, either directly or via an area 22. Furthermore, each semiconductor component has areas 21 which represent alignment marks for optical lithography. The surface 9 functions as an ohmic alignment mark for the electron beam and the area 4 functions as an active region of a field-effect transistor and is connected in an electrically-conductive manner with the clearing frame 2 via the area 22.

In a plan view, FIG. 10 illustrates a microwave field-effect transistor including a source region 13, a drain region 14 and a channel 16, with a drain terminal 20, a source terminal 19 and two gate terminals 18. The gate terminals 18 are connected with the gate 16 via connecting strips 17. The source region 13 is connected in an electrically-conductive manner with the clearing frame 2 via the strip 22.

Practicing the present invention enables one to obtain gate lengths of below 0.2 μm.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A semiconductor component comprising:
   a semiconductor wafer of first electrical conductivity;
   an active component region integrated into said semiconductor wafer containing a plurality of elements of said semiconductor component; and
   a non-metallized clearing frame surrounding said active region and electrically connected to at least one of said elements, said clearing frame consisting of a doped region in said semiconductor wafer having a second electrical conductivity which is higher than said first electrical conductivity, said doped region and said active region being non-overlapping.

2. The semiconductor component of claim 1, wherein:
   said clearing frame comprises a layer concentration of free charge carriers greater than $10^{10}$ cm$^{-2}$.

3. The semiconductor component of claim 1, wherein:
   said clearing frame comprises a layer concentration of free charge carriers greater than $10^{11}$ cm$^{-2}$.

4. The semiconductor component of claim 1, wherein:
   said clearing frame comprises a layer concentration of free charge carriers greater than $10^{12}$ cm$^{-2}$.

5. The semiconductor component of claim 1, wherein:
   said clearing frame comprises a layer concentration of free charge carriers greater than $10^{14}$ cm$^{-2}$.

6. The semiconductor component of claim 1, wherein:
   said plurality of elements includes a source zone of a field-effect transistor electrically connected to said clearing frame.

7. The semiconductor component of claim 1, wherein:
   said plurality of elements includes a drain zone of a field-effect transistor electrically connected to said clearing frame.

8. The semiconductor component of claim 1, and further comprising:
   an alignment mark on a surface of said semiconductor wafer on which said active region is disposed for alignment of a particle beam, said alignment mark electrically connected to said clearing frame.

9. A semiconductor component comprising:
   a semiconductor wafer of a first electrical conductivity;
   an active component region integrated into said semiconductor wafer containing a plurality of elements of said semiconductor component; and
   a non-metallized ion-implanted clearing frame surrounding said active region and electrically connected to at least one of said elements, said clearing frame consisting of a doped region in said semiconductor wafer having a concentration of free charge carriers greater than $10^{10}$ cm$^{-2}$, said doped region having a second electrical conductivity which is higher than said first electrical conductivity, and said doped region and said active region being non-overlapping.

* * * * *